(12) United States Patent
Chou et al.

(10) Patent No.: US 7,544,623 B2
(45) Date of Patent: Jun. 9, 2009

(54) METHOD FOR FABRICATING A CONTACT HOLE

(75) Inventors: Pei-Yu Chou, Tainan County (TW); Wen-Chou Tsai, Tao-Yuan (TW); Jiunn-Hsiung Liao, Tainan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 500 days.

(21) Appl. No.: 11/530,886

(22) Filed: Sep. 11, 2006

(65) Prior Publication Data

US 2008/0064203 A1 Mar. 13, 2008

(51) Int. Cl.
*H01L 21/302* (2006.01)
*H01L 21/461* (2006.01)

(52) U.S. Cl. ............... 438/736; 438/637; 438/702; 438/738; 257/E21.577

(58) Field of Classification Search ........... 438/637, 438/702, 735–738; 257/E21.577
See application file for complete search history.

(56) References Cited

U.S. PATENT DOCUMENTS

2006/0240639 A1* 10/2006 Akiyama .............. 438/445

* cited by examiner

*Primary Examiner*—Thanhha Pham
(74) *Attorney, Agent, or Firm*—Winston Hsu

(57) ABSTRACT

A method for fabricating a contact hole is provided. A semiconductor substrate having thereon a conductive region is prepared. A dielectric layer is deposited on the semiconductor substrate and the conductive region. An etching resistive layer is coated on the dielectric layer. A silicon-containing hard mask bottom anti-reflection coating (SHB) layer is then coated on the etching resistive layer. A photoresist layer is then coated on the SHB layer. A lithographic process is performed to form a first opening in the photoresist layer. Using the photoresist layer as a hard mask, the SHB layer is etched through the first opening, thereby forming a shrunk, tapered second opening in the SHB layer. Using the etching resistive layer as an etching hard mask, etching the dielectric layer through the second opening to form a contact hole in the dielectric layer.

31 Claims, 8 Drawing Sheets

METHOD FOR FABRICATING A CONTACT HOLE

BACKGROUND OF THE INVENTION

1. Field of the Invention

The present invention is generally related to the field of semiconductor fabrication. More particularly, the present invention is related to an improved method of fabricating contact holes, via holes or openings on a semiconductor wafer, which is suited for semiconductor processes beyond 65 nm or 45 nm.

2. Description of the Prior Art

The trend to micro-miniaturization, or the ability to fabricate semiconductor devices with feature size smaller than 65 nanometers, has presented difficulties when attempting to form contact holes (especially for high aspect ratio contact holes) in a dielectric layer to expose underlying conductive regions.

Conventionally, photoresist-mask approach and hard-mask approach are employed in the fabrication of contact or via holes on a semiconductor wafer. The aforesaid photoresist-mask approach has a shortcoming in that the 193 nm photoresist (reactive to 193 nm wavelength light) has its optical limitations in the optical lithographic process. For example, for fabricating a contact hole with line width of 65 nm, limited to optical limitation of a 180-200 nm pitch, only an in-line after development inspect critical dimension (ADICD) of about 120 nm can be achieved.

In order to increase the process window and depth of focus (DOF) of photoresist, it is necessary to decrease the thickness of the photoresist, which increases difficulty of subsequent dry etching process due to insufficient thickness of the photoresist that acts as an etching hard mask. Furthermore, The aforesaid photoresist-mask approach has drawbacks such as so-called standard wave problem and bowling profile problem.

The aforesaid hard-mask approach typically utilizes an etching hard mask containing metals or metal alloys that increases the complexity of the contact process. Besides the etching resistance of the hard mask itself, there are so many factors that are needed to take into account when using metal hard mask in the contact process. For example, the deposition temperature of the hard mask can not exceed 400° C. in order not to affect the previously formed layers such as silicide layers of a metal-oxide-semiconductor (MOS) transistor device. It is also a problem of removing the remanent metal hard mask after etching the contact hole.

In light of the above, there is a need in this industry to provide an improved method for fabricating contact holes, via holes or openings on a semiconductor wafer that does not use metal hard mask and is capable of tacking the above-mentioned difficulties and problems, and achieving the desired after etch inspection critical dimension (AEICD) and contact hole profile.

SUMMARY OF THE INVENTION

It is one object of the present invention to provide an improved method for fabricating contact holes on a semiconductor wafer, in order to solve the above-mentioned problems.

According to the claimed invention, a method for fabricating a contact hole is provided. A semiconductor substrate having thereon a conductive region is prepared. A dielectric layer is deposited overlying the semiconductor substrate and the conductive region. An etching resistive layer is coated on the dielectric layer. A silicon-containing hard mask bottom anti-reflection coating (SHB) layer is then coated on the etching resistive layer. A photoresist layer is then coated on the SHB layer. A lithographic process is performed to form a first opening in the photoresist layer. The first opening has an after-development-inspection critical dimension (ADICD). Using the photoresist layer as a hard mask, the SHB layer is etched through the first opening, thereby forming a shrunk, tapered second opening in the SHB layer having an after-etch-inspection critical dimension (AEICD) at its bottom, wherein the AEICD is 40% to 80% of the ADICD. Using the SHB layer and the etching resistive layer as etching hard masks, respectively, etching the etching resistive layer and the dielectric layer through the second opening to form a contact hole in the dielectric layer, exposing a portion of the conductive region.

From one aspect of this invention, a method for fabricating a contact hole is disclosed. A semiconductor substrate having thereon a conductive region is provided. A dielectric layer is deposited overlying the semiconductor substrate and the conductive region. A lower photoresist layer is then coated on the dielectric layer. The lower photoresist layer is baked. A silicon-containing hard mask bottom anti-reflection coating (SHB) layer is coated on the lower photoresist layer. An upper photoresist layer is coated on the SHB layer. The upper photoresist layer is thinner than the lower photoresist layer. A lithographic process is performed to form a first opening in the upper photoresist layer. Using the upper photoresist layer as a hard mask, the SHB layer is etched through the first opening, thereby forming a shrunk, tapered second opening in the SHB layer. Using the SHB layer and the lower photoresist layer as etching hard masks, respectively, etching the lower photoresist layer and the dielectric layer through the second opening to form a contact hole in the dielectric layer, exposing a portion of the conductive region.

From another aspect of this invention, a method for fabricating a contact hole is disclosed. A semiconductor substrate having thereon a conductive region is provided. An contact etch stop layer (CESL) is deposited overlying the semiconductor substrate and the conductive region. A dielectric layer is deposited overlying the CESL. A lower photoresist layer is then coated on the dielectric layer. The lower photoresist layer is baked. A silicon-containing hard mask bottom anti-reflection coating (SHB) layer is coated on the lower photoresist layer. An upper photoresist layer is coated on the SHB layer. The upper photoresist layer is thinner than the lower photoresist layer. A lithographic process is performed to form a first opening in the upper photoresist layer. Using the upper photoresist layer as a hard mask, the SHB layer is etched through the first opening, thereby forming a shrunk, tapered second opening in the SHB layer. Using the SHB layer and the lower photoresist layer as etching hard masks, respectively, etching the lower photoresist layer and the dielectric layer through the second opening to form a contact hole in the dielectric layer, exposing a portion of the CESL. The CESL is etched through the contact hole to expose the conductive region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
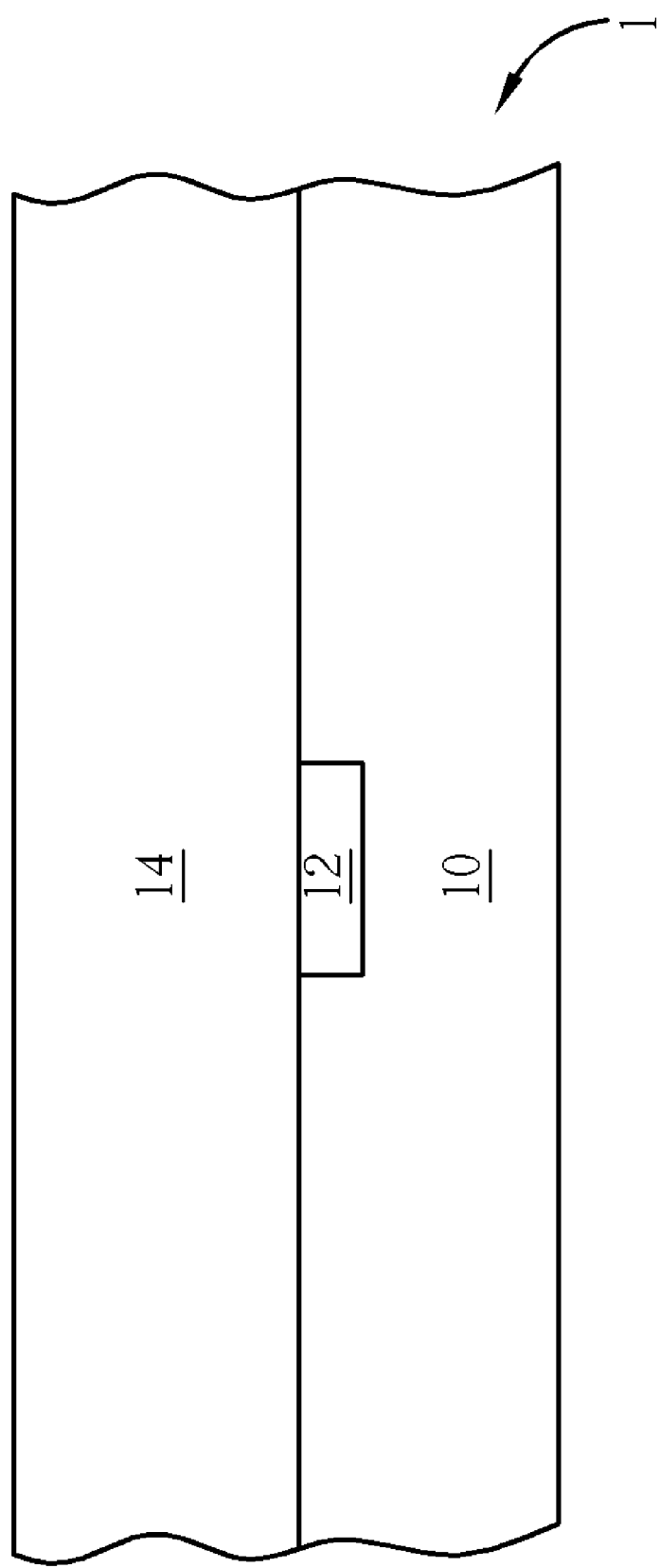
FIGS. 1-5 are schematic, cross-sectional diagrams illustrating an exemplary method for fabricating a contact/via hole on a semiconductor wafer in accordance with one preferred embodiment of this invention.

Please refer to FIGS. 1-5. FIGS. 1-5 are schematic, cross-sectional diagrams illustrating an exemplary method for fabricating a contact/via hole on a semiconductor wafer in accordance with one preferred embodiment of this invention. As shown in FIG. 1, a semiconductor wafer 1 having thereon a base layer 10 is provided. A conductive region 12 is provided in the base layer 10. The base layer 10 may be a semiconductor substrate, for example, silicon substrate, SiGe substrate, silicon-on-insulator (SOI) or any suitable substrates. In such case, the conductive region 12 may be a doping region or diffusion region such as a source/drain region of a MOS transistor device.

In some other cases, the base layer 10 may be an inter-layer dielectric (ILD) layer, for example, doped silicate glass, silicon dioxide, low-dielectric constant materials and so on. In such cases, the conductive region 12 may be a lower metal interconnection inlaid in the base layer 10, for example, a copper wiring fabricated by conventional damascene or dual damascene processes. It is understood that a barrier layer (not shown) is typically required to prevent copper from out diffusing into the base layer 10 during the damascene process.

A dielectric layer 14 is deposited on the surface of the base layer 10 and on the conductive region 12. According to the preferred embodiment, the dielectric layer 14 may comprise doped silicate glass, silicon dioxide, low-k materials or the like. The dielectric layer 14 may be formed by chemical vapor deposition (CVD) methods or spin-on coating (SOC) methods.

Figure 2:
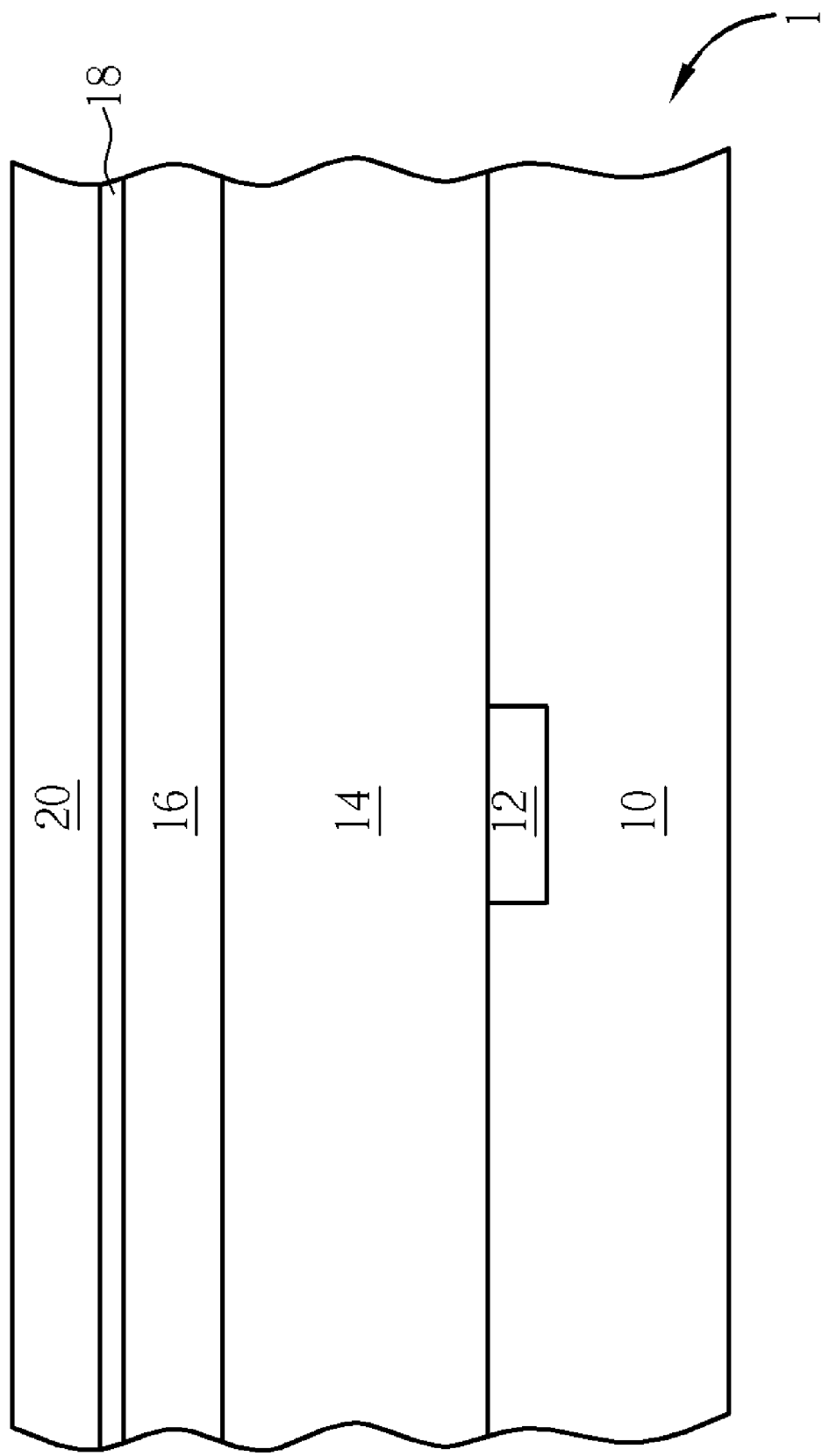

As shown in FIG. 2, an etching resistive layer 16 is formed on the dielectric layer 14. The etching resistive layer 16 may comprise novolac resins or i-line photoresist materials and preferably has a thickness of about 1500-3000 angstroms, more preferably 1800 angstroms. According to the preferred embodiment, the etching resistive layer 16 is made of i-line photoresist that is coated on the dielectric layer 14 by using ordinarily photoresist coating procedure and then baked.

Figure 8:
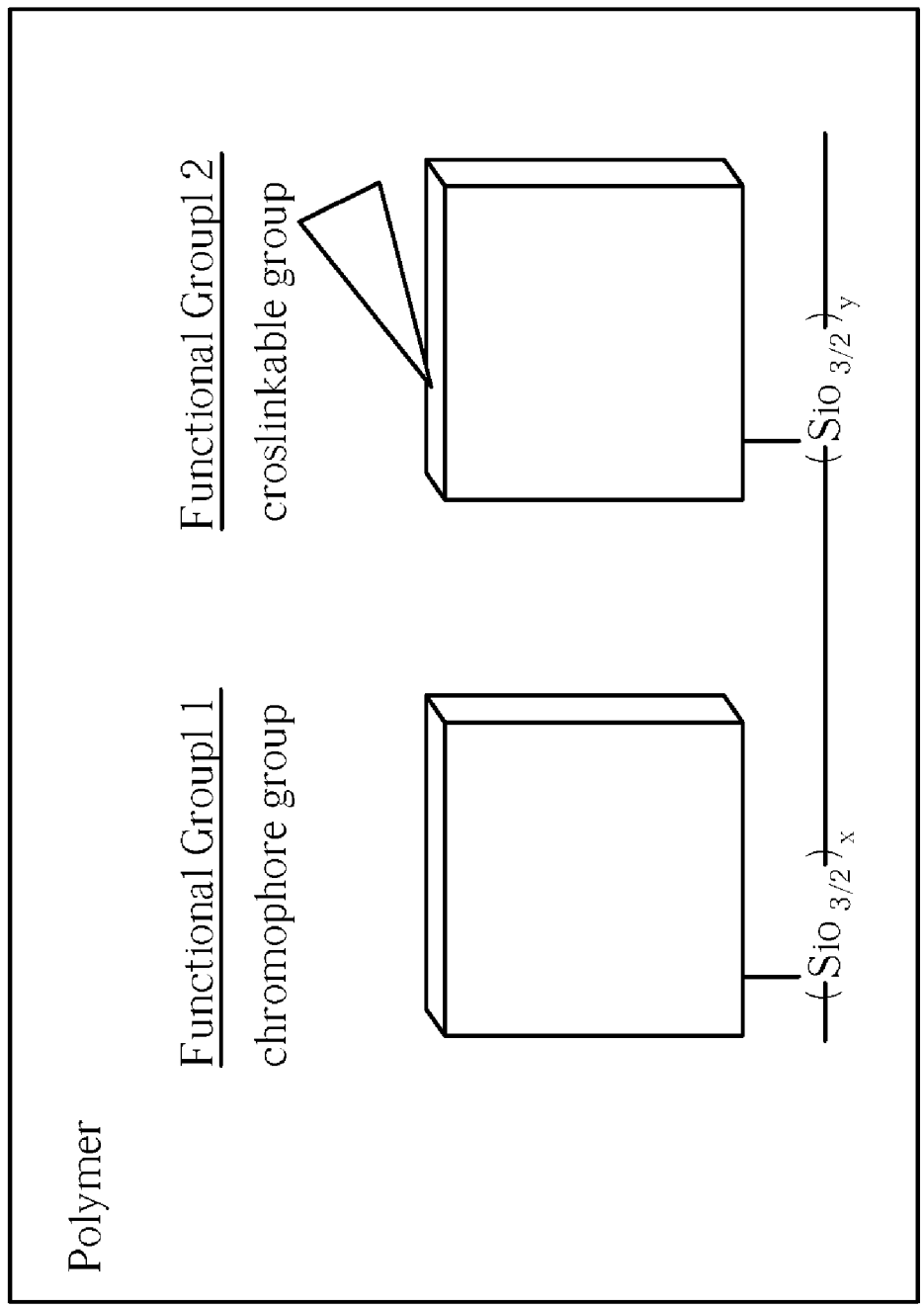
FIG. 8 is a schematic diagram showing an exemplary organosilicon polymer structure comprising at least a chromophore group and a crosslinkable group according to this invention.

Subsequently, a Silicon-containing Hard-mask Bottom anti-reflection coating (SHB) layer 18 is formed on the etching resistive layer 16. According to the preferred embodiment, the SHB layer 18 comprises organosilicon polymers or polysilane comprising at least a chromophore group and a crosslinkable group with silicon content of about 5% wt. to 30% wt., preferably 15% wt. to 25% wt. In other cases, the SHB layer 18 further comprises crosslinking agent. An exemplary organosilicon polymer structure comprising at least a chromophore group and a crosslinkable group according to this invention is demonstrated in FIG. 8.

According to the preferred embodiment, the SHB layer 18 can exhibit various etching resistance by adjusting the silicon content of the SHB layer 18. The SHB layer 18 exhibits anti-reflective effect during exposure, a high etch selectivity in relative to the underlying etching resistive layer 16, and excellent dry etching resistance.

According to the preferred embodiment, the silicon content of the SHB layer 18 ranges between 15% wt. and 25% wt. and has a thickness of about 150-1100 angstroms, preferably 800 angstroms. According to the preferred embodiment, the SHB layer 18 is coated on the etching resistive layer 16 using spin-on coating methods at relatively lower temperatures. By doing this, the previously formed layers such as silicide layers of MOS transistor devices will not be affected.

According to the preferred embodiment, after coating the SHB layer 18, a post baking process may be carried out. In another embodiment, the etching resistive layer 16 is not baked immediately after coating, but the etching resistive layer 16 and the SHB layer 18 are baked together in one step.

Still referring to FIG. 2, after coating the SHB layer 18, a photoresist layer 20 is coated on the SHB layer 18. According to the preferred embodiment, the photoresist layer 20 is ArF resist or 193 nm resist. According to this invention, the thickness of the photoresist layer 20 is reduced because the main function of the photoresist layer 20 is to transfer the pattern defined in the photoresist layer 20 merely to the underlying SHB layer 18 and acts as an dry etching hard mask when etching the SHB layer 18 during pattern transfer.

According to the preferred embodiment, the thickness of the photoresist layer 20 only ranges between 600 angstroms and 2200 angstroms, preferably 1500 angstroms. According to the prior art methods, the thickness of the 193 nm resist is at least 3500 angstroms to provide adequate etching resistance during pattern transfer. It is advantageous to use the present invention because a larger process window and more accurate and precise contact hole pattern are obtained in the lithographic process.

According to the preferred embodiment, the thickness of the photoresist layer 20 is smaller than the thickness of the etching resistive layer 16. According to the preferred embodiment, the SHB layer 18 has a high etch selectivity in relative to the underlying etching resistive layer 16, meaning that the etching rate of the SHB layer 18 is much lower than the etching rate of the etching resistive layer 16.

Figure 3:
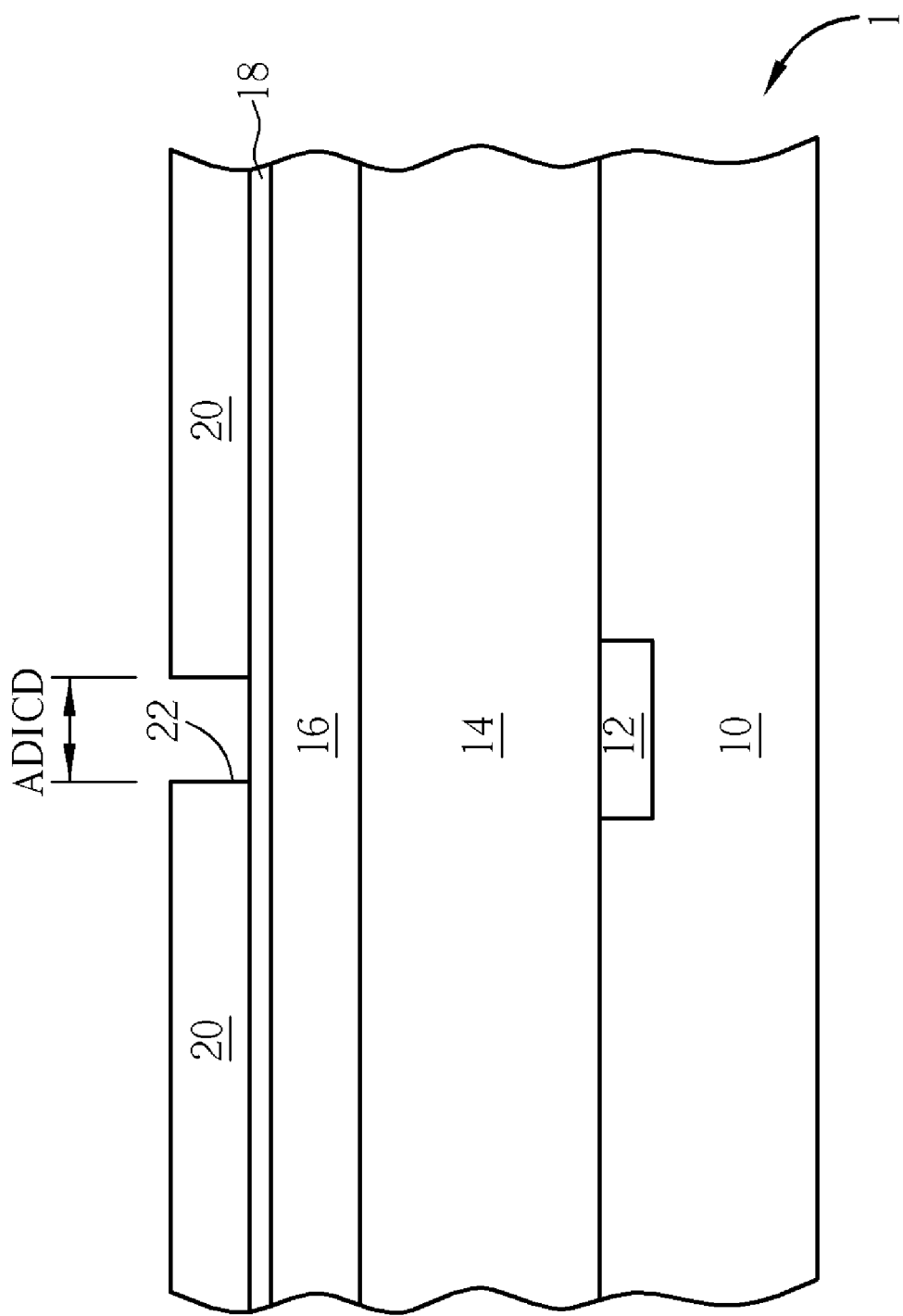

As shown in FIG. 3, a lithographic process is then performed to create an opening 22 in the photoresist layer 20. The aforesaid lithographic process may include typical exposure and development processes. The opening 22 defines the pattern, shape, and position of the contact hole to be formed in the underlying dielectric layer 14. The opening 22 exposes a portion of the surface of the SHB layer 18 and has an after development inspection critical dimension (ADICD), for example, an ADICD of about 65 nm.

Figure 4:
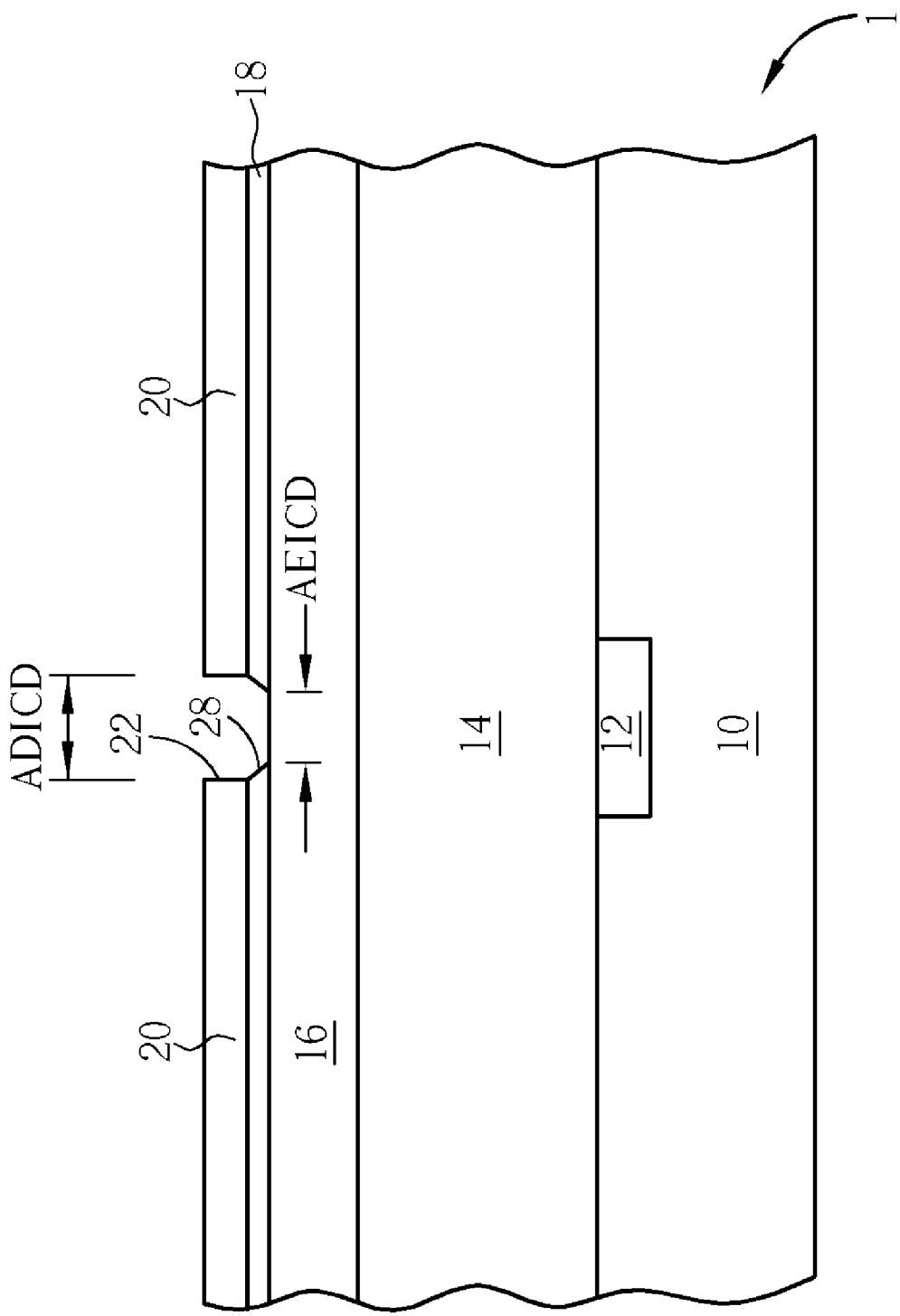

As shown in FIG. 4, using the patterned photoresist layer 20 as an etching hard mask, a dry etching process is carried out to transfer the contact hole pattern defined by the opening 22 into the underlying SHB layer 18, thereby forming an opening 28 exposing a portion of the etching resistive layer 16. According to the preferred embodiment, the aforesaid dry etching process uses etchant gas comprising at least tetrafluoromethane ($CF_4$) and hydrogen-containing fluoromethane such as trifluoromethane ($CHF_3$).

For example, the dry etching conditions when using $CF_4$/$CHF_3$ as an etchant gas for etching the SHB layer 18 through the opening 22 may include: a pressure of about 80 millitorrs to 150 millitorrs, preferably 120 millitorrs; a bias power of 500 W to 600 W; a $CF_4$ gas flowrate of about 200 sccm to 300 sccm, preferably 200 sccm; a $CHF_3$ gas flowrate of about 5 sccm to 30 sccm, preferably 15 sccm; and a duration of about 30 seconds to 100 seconds, preferably 35 seconds.

According to the preferred embodiment, the aforesaid hydrogen-containing fluoromethane may be expressed by $CH_xF_y$, wherein x=1, 2 or 3; y=1, 2 or 3; and x+y=4.

As specifically indicated in FIG. 4, it is one salient feature of this invention that the opening 28 has a tapered sidewall such that the dimension at the bottom of the opening 28 is smaller than the AEICD of the opening 22. For example, the bottom of the opening 28 has a dimension of 45 nm. The tapered opening 28 is formed due to the polymer rich etching environment provided by adding the hydrogen-containing fluoromethane into the etchant gas mixture.

According to the preferred embodiment, the opening 28 has an AEICD (bottom) that is about 40% to 80% of the ADICD of the opening 22, that is, hole shrinkage of about 20% to 60%.

Furthermore, it is noteworthy that the tapered opening 28 can only be formed by using etchant gas comprising tetrafluoromethane ($CF_4$) and hydrogen-containing fluoromethane as previously mentioned. Other fluoromethane that contains no hydrogen such as $C_4F_6$ cannot produce the same shrunk and tapered opening 28 in the SHB layer 18 because when $C_4F_6$ is used, for example, severe side corrosion occurs and resulting in bridging between adjacent contact holes in a dense area.

Figure 5:
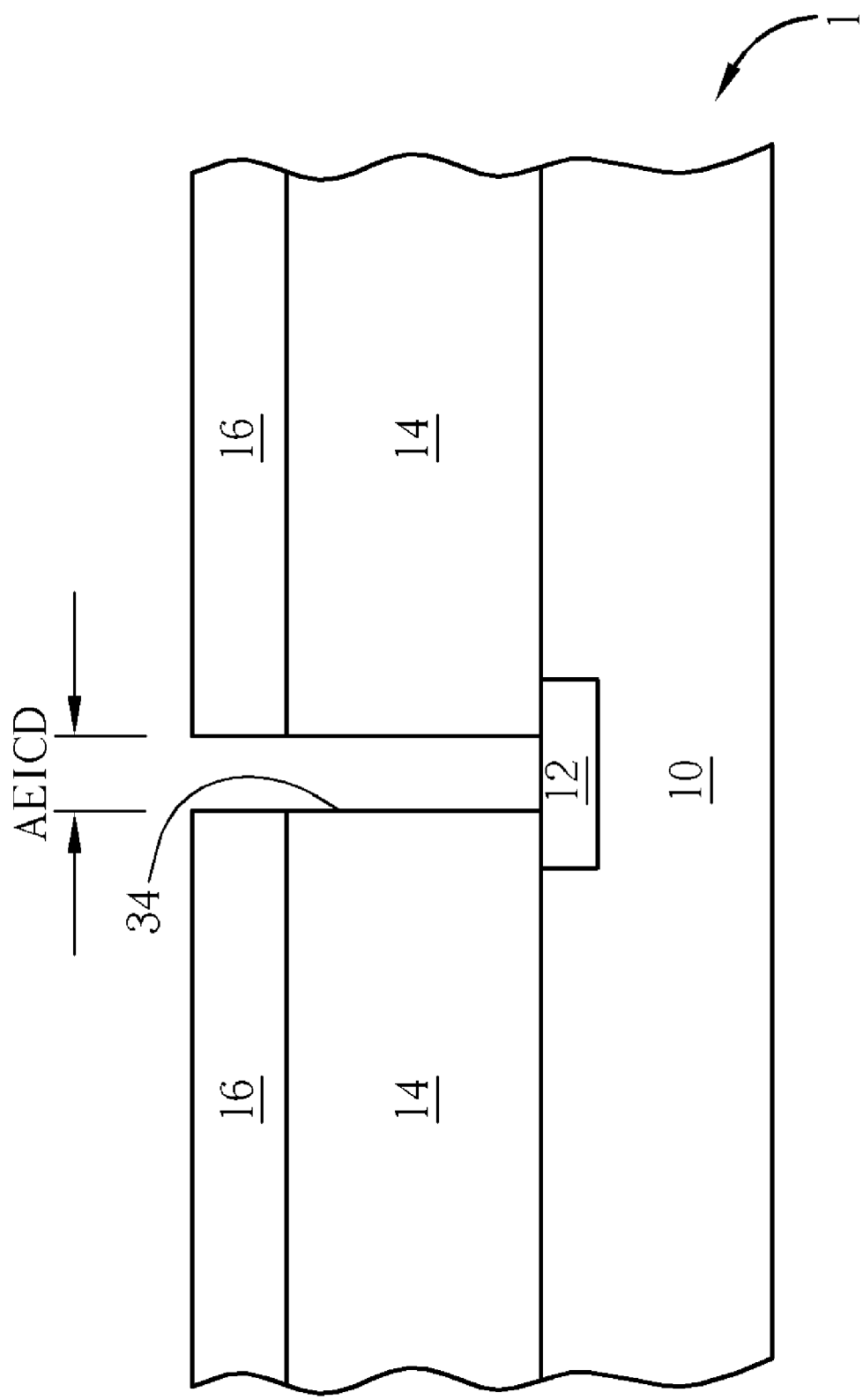

As shown in FIG. 5, after the pattern transferring from the photoresist layer 20 to the SHB layer 18 and shrinkage of the opening 28, using the SHB layer 18 as a dry etching hard mask, another anisotropic dry etching process is carried out to etch the exposed etching resistive layer 16 through the opening 28. As previously mentioned, at this stage, the etching rate of the etching resistive layer 16 is much higher than that of the SHB layer 18 (i.e., the SHB layer 18 exhibits high etch selectivity relative to the etching resistive layer 16). The bottom AEICD of the opening 28 is transferred into the etching resistive layer 16 having approximately the same AEICD as opening 28. Subsequently, using the etching resistive layer 16 as an etching hard mask, the dielectric layer 14 is etched to form a contact hole 34 therein. The contact hole 34 has approximately the same bottom AEICD, for example, 45 nm, as the opening 28. The contact hole 34 exposes a portion of the conductive region 12.

According to the preferred embodiment, the dimension shrinkage of the contact hole 34 may range between 20% and 40% relative to the ADICD of the opening 22.

For example, the dry etching conditions for etching the etching resistive layer 16 may include: a pressure of about 10 millitorrs; a bias power of 700 W to 300 W; a gas mixture of CO/O2/N2 with respective flowrate of 250/30/200 sccm; and a duration of about 60 seconds.

Figure 6:
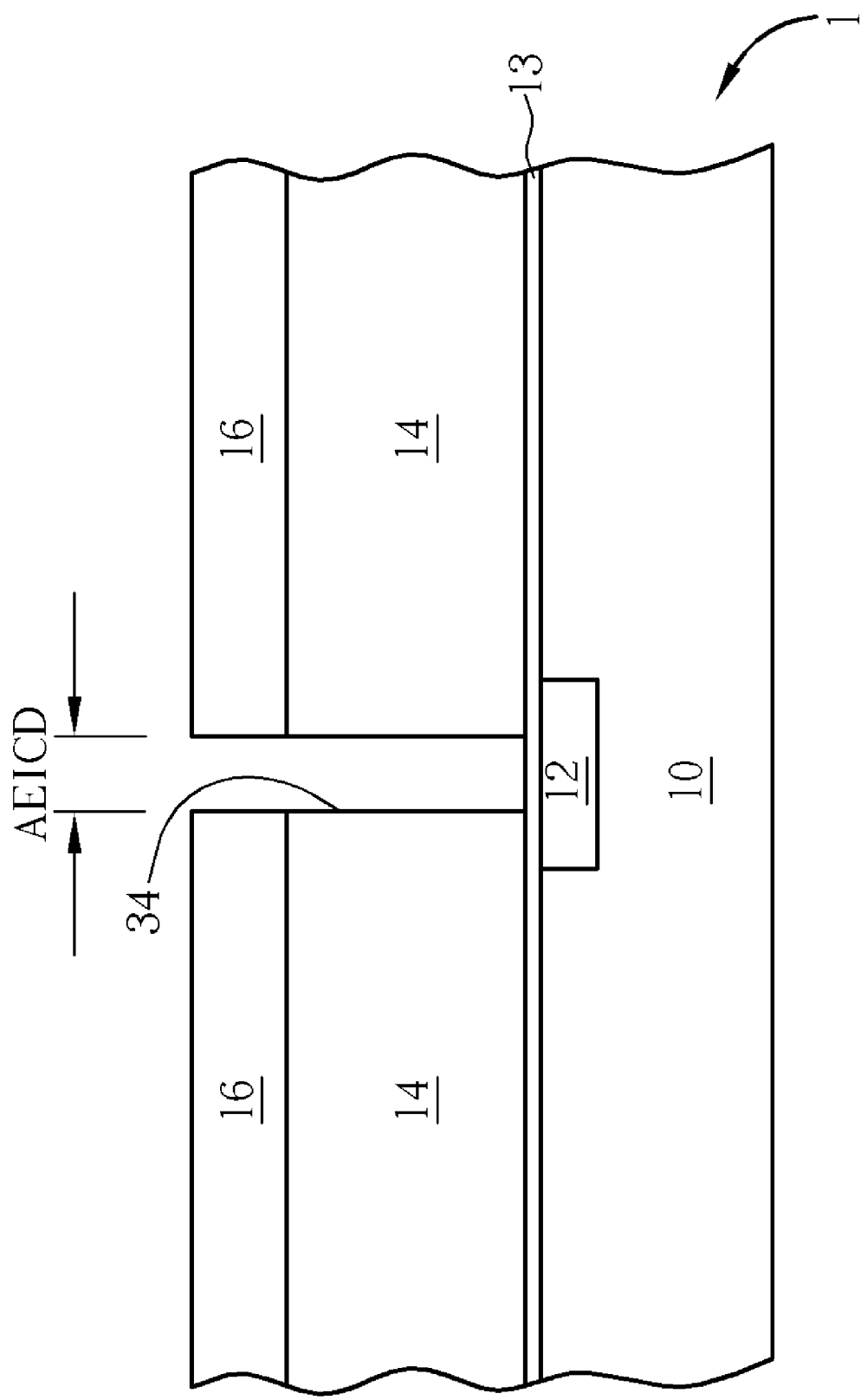
FIGS. 6 and 7 are schematic, cross-sectional diagrams illustrating another preferred embodiment of this invention.
Figure 7:
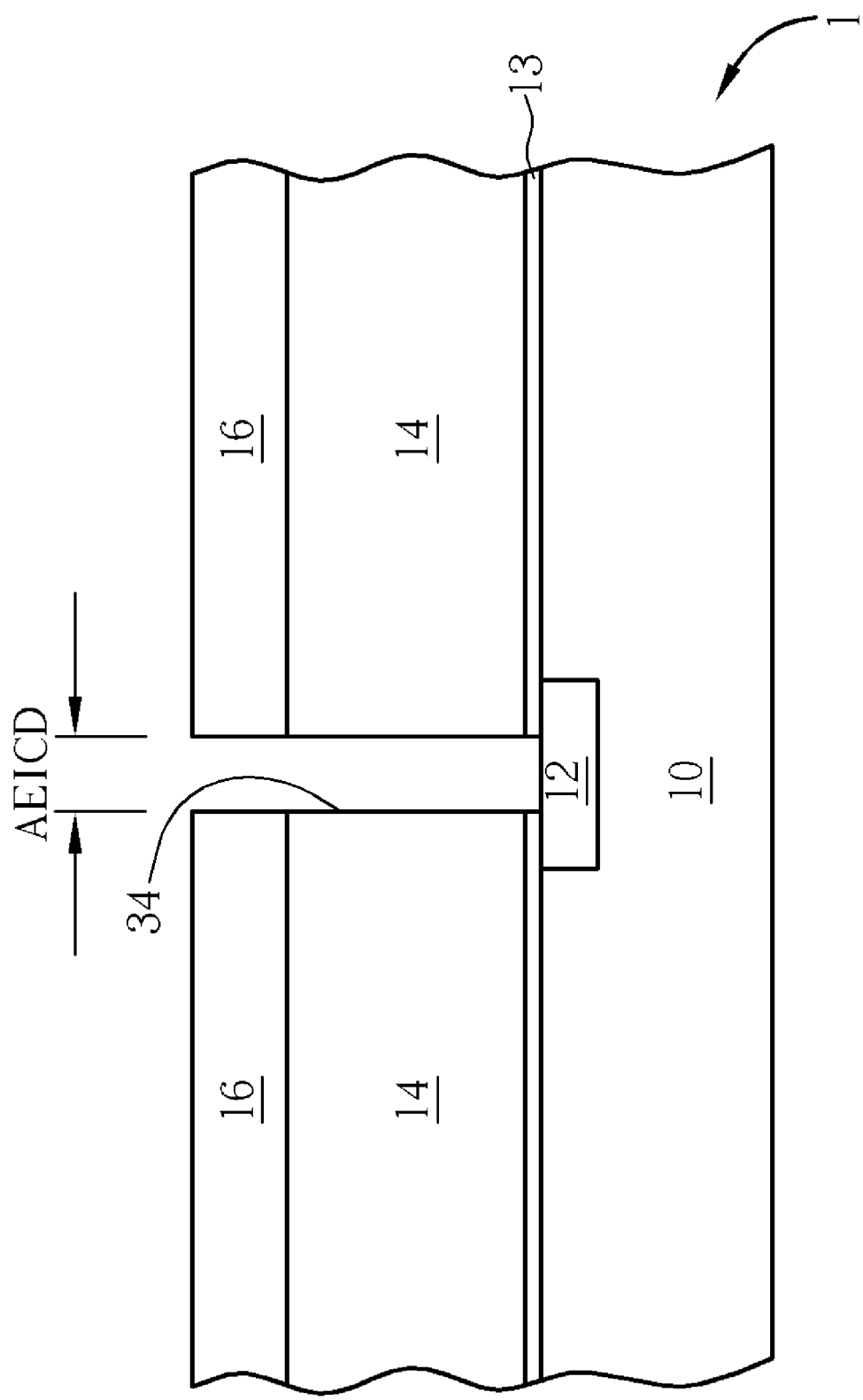

FIGS. 6 and 7 are schematic, cross-sectional diagrams illustrating another preferred embodiment of this invention. As shown in FIG. 6, in accordance with this preferred embodiment, a contact etching stop layer (CESL) 13 overlies the base layer 10 and the conductive region 12. The dielectric layer 14 overlies the CESL 13. The CESL 13 may comprise silicon nitride, but not limited thereto. Preferably, the CESL 13 has a thickness of about 400-1500 angstroms.

The contact hole 34 in FIG. 6 is formed utilizing the same process steps as set forth in FIG. 1 to FIG. 4. Likewise, after the pattern transferring from the photoresist layer 20 to the SHB layer 18 and shrinkage of the opening 28, using the SHB layer 18 as a dry etching hard mask, another anisotropic dry etching process is carried out to etch the exposed etching resistive layer 16 through the opening 28. The bottom AEICD of the opening 28 is transferred into the etching resistive layer 16 having approximately the same AEICD as opening 28. Subsequently, using the etching resistive layer 16 as an etching hard mask, the dielectric layer 14 is etched to form the contact hole 34 therein. The contact hole 34 has approximately the same bottom AEICD, for example, 45 nm, as the opening 28. The contact hole 34 exposes a portion of the CESL 13.

As shown in FIG. 7, after the formation of the contact hole 34, another dry etching process is carried out to etch the exposed CESL 13 through the contact hole 34, thereby exposing the underlying conductive region 12.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a contact hole, comprising:
providing a semiconductor substrate having thereon a conductive region;
depositing a dielectric layer overlying said semiconductor substrate and said conductive region;
coating an etching resistive layer on said dielectric layer;
coating a silicon-containing layer on said etching resistive layer;
coating a photoresist layer on said silicon-containing layer;
performing a lithographic process to form a first opening in said photoresist layer, said first opening having an after-development-inspection critical dimension (ADICD);
using said photoresist layer as a mask, dry etching said silicon-containing layer through said first opening, thereby forming a shrunk second opening in said silicon-containing layer; and
using said silicon-containing layer and said etching resistive layer as etching hard masks, respectively, etching said etching resistive layer and said dielectric layer through said second opening to form a contact hole in said dielectric layer to expose a portion of said conductive region, wherein an after-etch-inspection critical dimension (AEICD) is defined at a bottom of the silicon-containing layer is 40% to 80% of said ADICD.

2. The method according to claim 1 wherein said etching resistive layer comprises novolac resins.

3. The method according to claim 1 wherein said etching resistive layer comprises i-line photoresist.

4. The method according to claim 1 wherein said etching resistive layer has a thickness of 1500-3000 angstroms.

5. The method according to claim 1 wherein said silicon containing layer comprises organosilicon polymer or polysilane.

6. The method according to claim 1 wherein said silicon containing layer is coated on said etching resistive layer by using spin-on coating methods.

7. The method according to claim 1 wherein after coating said silicon containing layer, the method further comprises a baking process.

8. The method according to claim 1 wherein said silicon containing layer has silicon content of 5% wt. to 30% wt.

9. The method according to claim 1 wherein said silicon containing layer has a thickness of 150-1100 angstroms.

10. The method according to claim 1 wherein said etching of said silicon containing layer through said first opening utilizes tetrafluoromethane ($CF_4$) and hydrogen-containing fluoromethane as an etchant gas.

11. The method according to claim 10 wherein said hydrogen-containing fluoromethane is $CH_xF_y$, wherein x=1, 2 or 3; y=1, 2 or 3.

12. The method according to claim 1 wherein said photoresist layer is thinner than said etching resistive layer.

13. The method according to claim 12 wherein said photoresist layer has a thickness of 600-2200 angstroms.

14. The method according to claim 1 wherein said photoresist layer is photoresist reactive to 193 nm wavelength light.

15. The method according to claim 1 wherein said silicon-containing layer is a silicon-containing hard mask bottom anti-reflection coating (SHB) layer.

16. A method for fabricating a contact hole, comprising:
providing a semiconductor substrate having thereon a conductive region;
depositing a dielectric layer overlying said semiconductor substrate and said conductive region;
coating a lower photoresist layer on said dielectric layer;
coating a silicon-containing layer on said lower photoresist layer;
coating an upper photoresist layer on said silicon-containing layer, wherein said upper photoresist layer is thinner than said lower photoresist layer;
performing a lithographic process to form a first opening in said upper photoresist layer;
using said upper photoresist layer as a mask, dry etching said silicon-containing layer through said first opening, thereby forming a shrunk second opening in said silicon-containing layer; and
using said silicon-containing layer and said lower photoresist layer as etching hard masks, respectively, etching said lower photoresist layer and said dielectric layer through said second opening to form a contact hole in said dielectric layer, exposing a portion of said conductive region.

17. The method according to claim 16 wherein said lower photoresist layer comprises novolac resins.

18. The method according to claim 16 wherein said etching resistive layer comprises i-line photoresist.

19. The method according to claim 16 wherein said lower photoresist layer has a thickness of 1500-3000 angstroms.

20. The method according to claim 16 wherein said silicon containing layer comprises organosilicon polymer or polysilane.

21. The method according to claim 16 wherein said silicon containing layer is coated on said lower photoresist layer by using spin-on coating methods.

22. The method according to claim 16 wherein after coating said silicon containing layer, the method further comprises a baking process.

23. The method according to claim 16 wherein said silicon containing layer has silicon content of 5% wt. to 30% wt.

24. The method according to claim 16 wherein said silicon containing layer has a thickness of 150-1100 angstroms.

25. The method according to claim 16 wherein said etching of said silicon containing layer through said first opening utilizes tetrafluoromethane ($CF_4$) and hydrogen-containing fluoromethane as an etchant gas.

26. The method according to claim 25 wherein said hydrogen-containing fluoromethane is $CH_xF_y$, wherein x=1, 2 or 3; y=1, 2 or 3.

27. The method according to claim 16 wherein said upper photoresist layer has a thickness of 600-2200 angstroms.

28. The method according to claim 16 wherein said upper photoresist layer is photoresist reactive to 193 nm wavelength light.

29. The method according to claim 16 wherein a contact etch stop layer (CESL) deposited on said semiconductor substrate and said conductive region.

30. The method according to claim 29 wherein said CESL comprises silicon nitride.

31. The method according to claim 16 wherein said silicon-containing layer is a silicon-containing hard mask bottom anti-reflection coating (SHB) layer.

* * * * *